United States Patent
Robertson, III et al.

(10) Patent No.: US 6,534,413 B1
(45) Date of Patent: *Mar. 18, 2003

(54) METHOD TO REMOVE METAL AND SILICON OXIDE DURING GAS-PHASE SACRIFICIAL OXIDE ETCH

(75) Inventors: Eric Anthony Robertson, III, Easton, PA (US); Scott Edward Beck, Kutztown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 145 days.

This patent is subject to a terminal disclaimer.

(21) Appl. No.: 09/698,467

(22) Filed: Oct. 27, 2000

(51) Int. Cl.$^7$ ............................................. H01L 21/302
(52) U.S. Cl. ...................... 438/706; 438/711; 438/720; 438/722
(58) Field of Search .......................... 438/706–711, 720, 438/723, 722

(56) References Cited

U.S. PATENT DOCUMENTS

| | | | |
|---|---|---|---|
| 5,662,772 A | * 9/1997 | Scheiter et al. | 216/2 |
| 5,683,591 A | 11/1997 | Offenberg | 216/2 |
| 5,798,283 A | * 8/1998 | Montague et al. | 438/24 |
| 5,954,884 A | * 9/1999 | Lawing et al. | 134/1 |
| 5,963,788 A | * 10/1999 | Barron et al. | 438/48 |
| 6,159,859 A | * 12/2000 | Robertson, III et al. | 438/706 |
| 6,183,566 B1 | * 2/2001 | Lawing et al. | 134/1 |
| 6,242,165 B1 | * 6/2001 | Vaarstra | 430/329 |

OTHER PUBLICATIONS

Jour. Of Chinese Instit.of Engineers, "A CMOS Surface Micromachined . . . ", vol. 22, No. 3, (1999).
1998 Int'l. Symposium on Microelectronics, "Package Quality Testing Using Integrated . . . ", M. Waelti, et al.
Sensors and Actuators A 67 (1998), "Full Integration of a pressure–sensor system into a . . . " Scheiter, et al.
SPIE vol. 2881, "Linear array of CMOS double pass metal micromirrors", Buhler, et al.
ISHM '95 Proceedings, "Integrated Acceleration Sensors Compatible With The Standard . . . " Stadler, et al.
J. Micromech. Microeng. 7 (1997) "Silicon Dioxide Sacrificial Layer Etching In . . . " Buhler, et al.
Sensors and Actuators A 64 (1998) "HF/H2O vapor etching of SiO2 sacrificial layer for . . . " Anguita, et al.
Jour. Of Korean Phy. Society vol. 34 (1999) "Optimal Gas–Phase Etching for the Dry Release . . . " Jang, et al.
Jour. Of Microelectr. Systems, vol. 6, (1997) "Dry Release for Surface Micromachining . . . " Lee, et al.
Jour. Korean Phy. Society, vol. 30 (1997) Gas–Phase Etching of TEOS and PSG Sacrificial . . . Chung, et al.
Sensors and Actuators A 64 (1998) "Characterization of anhydrous HF gas–phase etching . . . " Lee, et al.
Mat. Res. Soc. Proc. vol. 518 "Mechanical Property Measurement . . . " Lu, et al.
Electrochem. And Solid–State Letters, 2 (1999) "Simultaneous Oxide and Metal Removal . . . " Robertson, et al.
SPIE vol. 3511 (1998) "Silicon Surface Micromachining by Anhydrous HF gas–phase . . . " Jang, et al.

\* cited by examiner

*Primary Examiner*—Benjamin L. Utech
*Assistant Examiner*—Charlotte A. Brown
(74) *Attorney, Agent, or Firm*—Geoffrey L. Chase

(57) ABSTRACT

A method for removing sacrificial materials and metal contamination from silicon surfaces during the manufacturing of an integrated micromechanical device and a microelectronic device on a single chip is provided which includes the steps of adjusting the temperature of the chip using a reaction chamber to a temperature appropriate for the selection of a beta-diketone and the design of micromechanical and microelectronic devices, cycle purging the chamber using an inert gas to remove atmospheric gases and trace amounts of water, introducing HF and the beta-diketone as a reactive mixture into the reaction chamber which contains at least one substrate to be etched, flowing the reactive mixture over the substrate until the sacrificial materials and metal contamination have been substantially removed, stopping the flow of the reactive mixture; and cycle purging the chamber to remove residual reactive mixture and any remaining reaction by-products. Optionally, an oxidant gas may be added to the reactive mixture to promote the oxidation of metal species.

17 Claims, No Drawings

METHOD TO REMOVE METAL AND SILICON OXIDE DURING GAS-PHASE SACRIFICIAL OXIDE ETCH

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The present invention is directed to fabrication of microelectromechanical systems (MEMS). In particular, the present invention is directed to removal of a silicon dioxide sacrificial layer during the fabrication of the MEMS.

MEMS utilize movable structures to perform their function. Examples of movable structures include cantilever beams (accelerometers), diaphragms (pressure sensors and microvalves), freely rotating structures (micromotors and microgears), or hollow tubes suspended over a cavity (micro-densitometer). The fabrication of these structures often incorporates a layer of silicon dioxide upon which the structure is fabricated. At some later step, the silicon dioxide layer is removed, thus freeing or releasing the structure. The silicon dioxide in this instance is an example of what is commonly referred to as a sacrificial layer. Silicon dioxide is the most common material used as a sacrificial layer. These layers are commonly removed with a liquid-based release etch.

There are two problems associated with the release etch. First, after the liquid-based release etch, it is not uncommon for the freed structure to be permanently adhered to the wafer, rendering the device useless. One reason this happens is that the liquid etchant can hold the freed structure in close contact to the substrate through capillary forces. As the liquid evaporates, the structure can become permanently affixed to the substrate either by bridging the gap with residue from the etchant or by "stiction". Stiction is a term describing the force of adhesion that exists between two surfaces. Even clean, smooth surfaces can have strong adhesive forces. Thus, stiction is not simply a matter of surface cleanliness.

The second problem is that the release etch tends to be incompatible with the steps required for fabricating microelectronic circuits, especially CMOS devices, unless special precautions are taken. This situation has contributed to the slow progress in merging MEMS devices with on-chip electronics. At present, such integration is achieved only if the circuitry can be completed before the release etch is performed, or if the MEMS device can be completed and encapsulated prior to the fabrication of the circuit. However, it is very difficult in practice to achieve such a design. Microelectronic processing steps require very clean surfaces, especially free of metallic contamination. MEMS processing steps, on the other hand, tend to be relatively dirty, with high levels of metal and organic contamination. Normally, in microelectronic processing steps, the wafer would be cleaned using a liquid phase clean. However, for MEMS devices, a liquid phase clean can lead to stiction problems for the freed microstructure.

There are also other instances where one might wish to keep a surface free of metal contamination while also removing sacrificial silicon dioxide. For example, on-chip cell testing devices in the area of BioMEMS (MEMS devices with a biological function) or devices intended to be used as chronic implants into biological systems (e.g. humans).

Integrating the micromechanical and the microelectronic devices onto a single chip has been an objective of the industry since the first MEMS devices were made. The initial challenge was to make micromechanical devices using the same or similar fabrication steps as microelectronic processing, thereby capitalizing on the economy of scale associated with mass production. MEMS devices are now being developed under guidelines that are considered CMOS compatible, which means that the devices are fabricated using only those processing steps and materials that are available for fabricating CMOS devices (i.e. silicon; silicon oxide; metal, typically aluminum and tungsten; and photoresist). Clearly, this imposes a stringent limit on the techniques and materials available to the design of the integrated systems. The circuits would be responsible, for example, for controlling the MEMS device, interpreting a signal from the device, and transmitting the needed information between the MEMS device and the macroscopic world.

One approach to making the integration of the MEMS and CMOS technologies possible is to perform the release etch at a stage after the electronic circuitry has been completed and, if required, a passivation layer deposited over the sensitive area to protect it from the release etch (see, for example, Dai, Ching-Liang and Pei-Zen Chang, "A CMOS surface micromachined pressure sensor," *Journal of the Chinese Institute of Engineers*, 22(3), pgs. 375–80 (1999); Waelti, M., et al., "Package quality testing using integrated pressure sensor," *Proceedings of the SPIE—The International Society for Optical Engineering* 3582, pgs. 981–86 (1999); Scheiter, T., et al., "Full integration of a pressure-sensor system into a standard BiCMOS process," *Sensors and Actuators A* 67, pgs. 211–214 (1998); Buhler, Johannes, Steiner, Franz-Peter, and Baltes, Henry, "Linear array of CMOS double pass metal micromirrors," *Proceedings of the SPIE—The International Society for Optical Engineering* 2881, pgs.75–82 (1996); Stadler, S. and Ajmera, P. K., "Integrated acceleration sensors compatible with the standard CMOS fabrication process," *Proceedings of the SPIE—The International Society for Optical Engineering*, 2649, p.95–100 (1995). Though there are a wide array of simple systems that can be constructed with this approach, it is limited in several ways. First, it requires that the electronic device and the micromechanical device be mostly independent of each other in a physical sense, interacting with one another only by way of an exchange of electronic or optical signals. Second, the processing of the integrated devices must be such that the electronic device is completed before the release etch is performed for the micromechanical device.

An alternative approach is to complete the MEMS device first and then build the microelectronic circuit. See, e.g., U.S. Pat. No. 5,798,283 (Montague et al.) and U.S. Pat. No. 5,963,788 (Barron et al.). In this case, the MEMS device must be encapsulated to prevent downstream contamination of the process tools needed for the microelectronic processing steps. This approach has drawbacks similar to those mentioned previously. In either case, the level of integration is relatively low in that the two devices are simply on the same chip and can exchange some type of signal. A higher level of integration would be to implement the electronic circuit onto the MEMS device.

At this level of integration, it may be necessary to perform the sacrificial etch prior to completing the electronic device. The sacrificial etch would release a structure or create some type of cavity to provide, for example, thermal isolation of a device. Such an ability would be imperative if it was desired to place the electronic device in the cavity or between two moving structures. However, the wafer would require cleaning after etching in order to begin or continue the microelectronic processing steps. The industry standard clean in this case would be a derivative of the RCA clean, which is a liquid phase process.

Liquid release etchants have the problem of leaving behind residue and, more significantly, leading to the permanent adherence of the movable structure to the fixed surface. When the sacrificial layer is silicon oxide, or more frequently phospho-silicate glass, the preferred etchant is generally either aqueous HF or buffered HF. See, e.g., Buhler, Johannes., Steiner, Franz-Peter., and Baltes, Henry, "Silicon dioxide sacrificial layer etching in surface micromachining," *J. Micromech. Microeng*, 7, p. R1–R13 (1997). Clearly, other materials may be suitable for the sacrificial layer and other options are available for the release etchant, but whenever there is a liquid phase present, there is a significant potential for stiction to become a problem.

The semiconductor industry has been experimenting with several gas-phase etchants for removing sacrificial silicon oxides: vapor phase $HF/H_2O$ mixtures, (see, e.g., Anguita, J. And Briones, F., "$HF/H_2O$ vapor etching of $SiO_2$ sacrificial layer for larger-area surface-micromachined membranes," *Sensors and Actuators A*, 64, pgs. 247–251 (1998), U.S. Pat. No. 5,662,772 (Scheiter et al.) and U.S. Pat. No. 5,683,591 (Offenberg)), vapor phase HF/Methanol mixtures (see, e.g., Jang, Won Ick, et al., "Optimal gas-phase etching for the dry release of polysilicon and SO1 microstructures," *Journal of the Korean Physical Society*, 34 (1), pg. 69–74 (1999), Lee, Yong-Il, et al., "Dry release for surface micromachining with HF vapor-phase etching", *Journal of Micromechanical Systems*, 6 (3), pgs. 226–233 (1997), Chung, Hoi Hwan, et al., "Gas-phase etching of TEOS and PSG sacrificial layers using anhydrous HF and $CH_3OH$", *Journal of the Korean Physical Society*, 30 (3), pgs. 628–631 (1997), Lee, Jong Hyun, et al., "Characterization of anhydrous HF gas phase etching with $CH_3OH$ for sacrificial oxide removal", *Sensors and Actuators A*, 64, pgs. 27–32 (1998), and Jang, Won Ick, et. al., "Silicon surface micromachining by anhydrous HF gas-phase etching with methanol", SPIE Conference on Micromachining and Microfabrication Process Technology IV, Santa Clara, Calif., 1998; SPIE Vol 35II, pg. 143.); and plasmas, (see Lu, M. S.-C., Zhu, X., and Fedder, G. K., "Mechanical property measurement of 0.5-$\mu$m CMOS microstructures, *Microelectromechanical Structures for Materials Research, Symposium*, Editors: Brown, S., et al., *Mater. Res. Soc. Symp. Proc.*, 518, pgs. 27–32 (1998)). Gas-phase etchants have the potential to release the structure while leaving behind little residue or water, which tend to promote stiction. However, these etchants have no capacity to clean a surface in preparation for further microelectronic processing steps. Steps that are particularly sensitive to metal contamination include oxide growth and dopant deposition. These steps re-introduce the wafers into the furnace tubes. Any metal on an exposed surface will migrate to the tube and contaminate the wafers in the current run and in subsequent runs. Thus, the silicon wafers must be free of any metallic contamination that can be transported to the furnace and ultimately other wafers.

Although there are examples of gas-phase metal removal techniques and examples of gas-phase oxide removal techniques, only the combination of anhydrous HF with a beta-diketone has been demonstrated to accomplish both simultaneously. See, e.g., Robertson, III, E. A., Beck, S. E., George, M. A., Bohling, D. A., and Waskiewicz, J. L., "Simultaneous oxide and metal removal from silicon surfaces", *Electrochemical and Solid-State Letters*, 2 (3), pgs. 91–93 (1998).

The 2,2,6,6-tetramethyl-3,5-heptanedione (hereinafter THD)/HF etch and cleaning processes can be controlled by varying reactor pressure and substrate temperature. Etching reagents include complexes of HF with one or more of the compounds selected from acetic acid, trifluoroacetic acid, trifluoroacetic anhydride, $\alpha$-diketone, and a $\beta$-diketoimine.

Metal removal during the release step may be advantageous in situations which require the structure to be metal-free. Current MEMS applications do not require such cleanliness because the front-end processing is completed before the release step is performed. However, as technology evolves and new applications are developed, that situation may change. A good example arises in the area of bio-MEMS applications designed for cell testing or chronic implants into living tissue. In the case of cell testing, the presence of metal contamination could alter the conditions of an experiment, especially if the experiment involved electrochemical measurements in a very low current range. For chronic implants, one would expect the presence of residual metals to become an issue in receiving final approval for human trials. Finally, it is conceivable that electronics and MEMS technologies will become increasingly integrated, eventually requiring further microelectronics front-end processing after MEMS processing. In this case, metal contamination control during MEMS processing will become important to prevent contamination of electronic devices and contamination of critical downstream process equipment (e.g. oxide tubes for bi-CMOS).

It is principally desired to provide a method for removing sacrificial materials and metal contamination from silicon surfaces during the manufacturing of an integrated micromechanical device and a microelectronic device on a single chip that overcomes the limitations of the prior art.

It is further desired to provide a method for removing sacrificial materials and metal contamination from silicon surfaces during the manufacturing of an integrated micromechanical device and a microelectronic device on a single chip that reduces the likelihood of sticking of a MEMS structure on a substrate from which it is formed.

It is still further desired to provide a method for removing sacrificial materials and metal contamination from silicon surfaces during the manufacturing of an integrated micromechanical device and a microelectronic device on a single chip where a release etch is compatible with MEMS and electronic devices.

It is further desired to provide a method for removing sacrificial materials and metal contamination from silicon surfaces during the manufacturing of an integrated micromechanical device and a microelectronic device on a single chip with substantially improved integration of micromechanical and microelectronic devices.

Finally, it is still further desired to provide a method for removing sacrificial materials and metal contamination from silicon surfaces during the manufacturing of an integrated micromechanical device and a microelectronic device on a single chip where liquid etchant is not used but gas-phase etchant is used that leaves behind little residue or water which tends to promote stiction.

The combination of anhydrous HF and beta-diketones removes silicon oxides and reduces metal contamination simultaneously. This chemistry has a potential application in micromachining when sacrificial oxide must be removed to free micromechanical structures. The new resulting surfaces must be metal-free if further front-end processing is required or if the structure is intended for bio-MEMS applications where metal contamination is unacceptable.

BRIEF SUMMARY OF THE INVENTION

A method for removing sacrificial materials and metal contamination from silicon surfaces during the manufacturing of an integrated micromechanical device and a microelectronic device on a single chip is provided which includes the steps of adjusting the temperature of the chip using a reaction chamber to a temperature appropriate for the selection of a selected beta-diketone and the design of micromechanical and microelectonic devices, cycle purging the chamber using an inert gas to remove atmospheric gases and trace amounts of water, introducing HF and the beta-diketone as a reactive mixture into the reaction chamber which contains at least one substrate to be etched, flowing the reactive mixture over the substrate until the sacrificial materials and metal contamination have been substantially removed, stopping the flow of the reactive mixture; and cycle purging the chamber to remove residual reactive mixture and any remaining reaction by-products. The inert gas is preferably nitrogen or argon. A diluent may be added to the reactive mixture. The diluent is preferably nitrogen, argon, helium, neon, xenon, krypton, or $SF_6$. An oxidant gas may be added to the reactive mixture to promote the oxidation of metal species. The oxidant gas is preferably oxygen, chlorine, or nitrous oxide. The step of stopping the flow of the reactive mixture may include stopping the oxidant flow first to allow additional metal removal, while continuing to add the diluent. The step of cycle purging the chamber to remove residual reactive mixture and any remaining reaction by-products may include heating the substrate gently to help in the removal of materials from less accessible areas of the silicon surfaces. A step of cycle purging the chamber while the reactive mixture is flowing may be made to facilitate transporting of reactants to active regions of the silicon surfaces and to facilitate removal of reaction by-products from the silicon surfaces, due to molecular diffusion limitations.

The HF is preferably anhydrous HF with not more than trace a mounts of water present as contaminant. The beta-diketone is preferably THD. The sacrificial materials are preferably silicon dioxide, silicon oxide, phosphorus and/or boron doped silicon dioxide and silicon oxynitrides.

BRIEF DESCRIPTION OF SEVERAL VIEWS OF THE DRAWINGS

Not applicable

DETAILED DESCRIPTION OF THE INVENTION

This process simultaneously cleans metal from a silicon surface and removes sacrificial oxide. The process uses the combination of anhydrous HF with a beta-diketone to remove metals (including iron, copper, and sodium) through the chelation of the metal species with a ligand supplied by the beta-diketone. Simultaneously, the HF and beta-diketone can also remove silicon dioxide, which is commonly used as a sacrificial layer.

The objective of this invention is to provide a dry method to remove sacrificial silicon oxide, such as those found in the production of MEMS, while simultaneously reducing metal contamination on the exposed surfaces. Such an invention would be applicable to MEMS technologies which require integration with on-chip circuitry.

This chemistry can also be extended to the removal of silicon oxide sacrificial layers in MEMS processing while at the same time providing a degree of metal contamination removal. The sacrificial layers may also be composed of other materials, including, for example, aluminum and copper (using fluorinated beta diketones and oxygen). The steps of the process are as follows.

First, the sample is heated or cooled to a temperature appropriate for the selection of beta-diketone and the design of the MEMS structure. Next, the chamber is cycle purged using an inert gas such as nitrogen or argon to remove atmospheric gases and trace amounts of water. HF and beta-diketone are introduced into a reaction chamber which contains the substrates to be etched. A diluent such as nitrogen, argon, helium, neon, xenon, or krypton may also be added to the mixture. An oxidant gas such as oxygen, chlorine, or nitrous oxide may also be added to promote the oxidation of metal species.

The reactive mixture is then caused to flow over the substrates to be etched until the sacrificial oxide and metal contamination have been satisfactorily removed. Flow of HF, beta-diketone, and oxidant (if present) are then discontinued. The oxidant flow may be stopped prior to stopping the flow of the HF and beta-diketone such that removal of oxidized metal continues. The flow of diluent may also continue after the oxidant flow is stopped. If necessary, the oxidant flow may be stopped sufficiently early such that substantially no removal of any metals from the structure of the micromechanical device occurs. Alternatively, the oxidant may be introduced and then purged from the chamber prior to introduction of the HF and beta-diketone. The chamber is then cycle purged to remove residual reactant and any remaining reaction byproducts. It may be desirable to heat the substrate gently to help in the removal of materials from less accessible areas of the structure.

It may also be advantageous to cycle purge the chamber while the HF/beta-diketone mixture is flowing if molecular diffusion limitations make it difficult to transport either the reactants to the active region of the etch or to remove reaction by-products from the active region.

It is noted that the HF is preferred to be anhydrous HF with not more than trace amounts of water present as a contaminant. This will reduce the formation of particles in the gas delivery system. Perfectly dry HF is not necessary in the reaction chamber because the reaction with the silicon dioxide produces water. The beta-diketone could be any of a range of compounds. Tetra-methyl heptane dionate (THD) has been shown to be effective at removing silicon dioxide and copper and iron from silicon surfaces. Similar beta-diketones and combinations of several different beta-diketones are likely also effective. The diluent can be any relatively inert (i.e. not reactive in this chemistry) gas, including but not limited to nitrogen, argon, helium, neon, xenon, krypton, or $SF_6$. The oxidant gas could be chlorine, oxygen, or nitrous oxide. The sacrificial material to be removed is preferred to be silicon dioxide, but any form of silicon oxide, including phosphorous and/or boron doped silicon dioxide and silicon oxynitrides, would be susceptible to attack by this chemistry.

It is known that there are useful operating temperature and pressure ranges for the HF/beta-diketone chemistry. These values may be obtained by experiment. Additionally, those ranges depend on the specific choice of the beta-diketone. In particular, as the volatility of the beta-diketone decreases, the operating temperature range shifts to lower temperatures. For example, THD in the presence of anhydrous HF removes silicon dioxide effectively between room temperature and about 200° C., with a maximum removal rate around 75° C. Outside the range of 25 to 200° C., the THD/HF combination has substantially no oxide removal ability. The range of useful temperatures depends on the choice of the beta-diketone.

The pressure range is limited at the low end by the lowest tolerable etch rate. The oxide etch rate will depend on the partial pressure of the gas phase constituents at the surface of the silicon dioxide being removed. The partial pressure at that location will depend on the bulk composition of that component and the diffusivity of the component into the structure being released. For silicon oxide removal from a flat surface (no diffusion limitations), the etch rate varies approximately linearly between 0 Å/min at zero partial pressure of THD and 50 Å/min at 500 Torr partial pressure of THD. One would expect the diffusivity to increase with decreasing pressure, so there is likely an optimum pressure which depends on the geometry of the sacrificial layer being removed and the composition of the reaction mixture.

Potential applications of this process include manufacturing of BioMEMS devices where metal contamination would interfere with the cell's function or interfere with the measurement being attempted. Another potential application is the integration of electronic circuitry with micromechanical accelerometers, pressure sensors, thermometers, or other miniaturized sensors. There is also an opportunity for application in systems which attempt to effect chemical changes on a micro scale, so-called microreactors. The level of integration between the MEMS devices and the control circuitry would require a fabrication process that allows microelectronic processing steps to be inserted in a MEMS fabrication sequence or vice verse.

Prior attempts to integrate MEMS devices with microelectronic circuitry essentially attempt to construct one device, either the MEMS device or the circuit, and protect that device until the other device can be completed. At best, this approach is limited when trying to integrate only two devices or devices that have very similar fabrication sequences. It will prove to be impossible to carry the integration forward without some means of cleaning the wafer surface in preparation for subsequent microelectronic steps. The process proposed here addresses the particular need to remove sacrificial oxide and then clean the surface for deposition or doping in a furnace tube, i.e. a pre-furnace clean. Accomplishing the etch and the clean in separate gas-phase steps would be significant in itself. Accomplishing both steps simultaneously would have an even greater advantage in both throughput and yield of the device.

Although illustrated and described herein with reference to specific embodiments, the present invention nevertheless is not intended to be limited to the details shown. Rather, various modifications may be made in the details within the scope and range of equivalents of the claims without departing from the spirit of the invention.

What is claimed is:

1. A method for removing sacrificial materials and metal contamination from silicon surfaces during the manufacturing of an integrated micromechanical device and a microelectronic device on a single chip, comprising the steps of:
    (a) adjusting the temperature of the chip using a reaction chamber, as necessary, to a temperature appropriate for the beta-diketone employed in step (c) and the design of the micromechanical and microelectronic devices;
    (b) cycle purging the chamber using an inert gas to remove atmospheric gases and trace amounts of water;
    (c) introducing HF and the beta-diketone as a reactive mixture into the reaction chamber which contains at least one substrate to be etched;
    (d) flowing the reactive mixture over the substrate until any sacrificial materials and metal contamination have been substantially removed;
    (e) stopping the flow of the reactive mixture; and
    (f) cycle purging the chamber to remove residual reactive mixture and any remaining reaction by-products.

2. The method for removing sacrificial materials and metal contamination of claim 1, wherein the inert gas is selected from the group consisting of nitrogen and argon.

3. The method for removing sacrificial materials and metal contamination of claim 1, including the step of adding a diluent to the reactive mixture.

4. The method for removing sacrificial materials and metal contamination of claim 3, wherein the step of adding the diluent includes adding a diluent selected from the group consisting of nitrogen, argon, helium, neon, xenon, krypton, and $SF_6$ to the mixture.

5. The method for removing sacrificial materials and metal contamination of claim 1, including the step of adding an oxidant gas to the reactive mixture to promote the oxidation of metal species.

6. The method for removing sacrificial materials and metal contamination of claim 5, wherein the step of adding the oxidant gas includes adding an oxidant gas selected from the group consisting of oxygen, chlorine, or nitrous oxide.

7. The method for removing sacrificial materials and metal contamination of claim 5, wherein the step of stopping the flow of the reactive mixture includes first stopping the oxidant flow to allow additional metal removal, while continuing to allow flow of the diluent.

8. The method for removing sacrificial materials and metal contamination of claim 1, wherein the step of cycle purging the chamber to remove residual reactive mixture and any remaining reaction by-products includes heating the substrate to help in the removal of the materials and contamination from less accessible areas of the silicon surfaces.

9. The method for removing sacrificial materials and metal contamination of claim 1, including the step of cycle purging the chamber while the reactive mixture is flowing to facilitate transport of the reactive mixture to active regions of the silicon surfaces and to facilitate removal of reaction by-products from the silicon surfaces.

10. The method for removing sacrificial materials and metal contamination of claim 1, wherein the step of introducing HF includes introducing anhydrous HF with not more than trace amounts of water present as contaminant.

11. The method for removing sacrificial materials and metal contamination of claim 1, wherein the beta-diketone is 2,2,6,6,-tetramethyl-3,5-heptanedione.

12. The method for removing sacrificial materials and metal contamination of claim 1, wherein the sacrificial materials are selected from the group consisting of silicon dioxide, silicon oxide, phosphorus and/or boron doped silicon dioxide and silicon oxynitrides.

13. The method for removing sacrificial materials and metal contamination of claim 1, wherein the sacrificial materials are metals.

14. The method for removing sacrificial materials and metal contamination of claim 7, where the oxidant flow is stopped sufficiently early in the process such that substantially no removal of metals from any structure of the micromechanical device occurs.

15. The method for removing sacrificial materials and metal contamination of claim 1, including the step of introducing and subsequently purging an oxidant gas into the reaction chamber prior to the step of introducing the reactive mixture.

16. In a process for the fabrication of a micro-electromechanical system which includes the step of providing a sacrificial layer of silicon oxide on a silicon surface, subsequently removing the sacrificial layer of silicon oxide and the removing of any metal contaminants from said silicon surface, the improvement which comprises:

effecting the simultaneous removal of said sacrificial layer of silicon oxide on said silicon surface and said removal of metal contaminates by contacting said silicon surface with a mixture of HF and a beta-diketone whereby said sacrificial layer is removed during the fabrication of said micro-electromechanical system.

17. The process of claim 16 wherein the beta-diketone is 2,2,6,6,-tetramethyl-3,5-heptanedione.

* * * * *